United States Patent
Rangasayee et al.

(10) Patent No.: US 6,625,796 B1
(45) Date of Patent: Sep. 23, 2003

(54) APPARATUS AND METHOD FOR PROGRAMMING A SET OF PROGRAMMABLE LOGIC DEVICES IN PARALLEL

(75) Inventors: Krishna Rangasayee, Mountain View, CA (US); Nitin Prasad, San Jose, CA (US)

(73) Assignee: Altera Corporation, San Jose, CA (US)

( * ) Notice: Subject to any disclaimer, the term of this patent is extended or adjusted under 35 U.S.C. 154(b) by 51 days.

(21) Appl. No.: 09/650,790

(22) Filed: Aug. 30, 2000

Related U.S. Application Data

(60) Provisional application No. 60/151,597, filed on Aug. 30, 1999.

(51) Int. Cl.[7] .......................... G06F 17/50; H03K 19/00
(52) U.S. Cl. .......................... 716/17; 716/16; 711/103; 703/15; 326/38; 326/39; 326/41
(58) Field of Search .................. 326/41, 39; 716/1–21; 717/139; 327/99; 368/113; 710/5; 711/103; 712/10

(56) References Cited

U.S. PATENT DOCUMENTS

| | | | | |
|---|---|---|---|---|
| 5,212,652 A | * | 5/1993 | Agrawal et al. | 326/41 |
| 6,052,755 A | * | 4/2000 | Terrill et al. | 711/103 |
| 6,112,020 A | * | 8/2000 | Wright | 716/17 |
| 6,134,707 A | * | 10/2000 | Herrmann et al. | 717/139 |

\* cited by examiner

Primary Examiner—Leigh M. Garbowski
Assistant Examiner—Helen Rossoshek
(74) Attorney, Agent, or Firm—Pennie & Edmonds LLP

(57) ABSTRACT

A method of configuring a set of programmable logic devices includes the step of partitioning a programming file into a set of programmable logic device configurations. A set of programmable logic devices are subsequently configured, in parallel, in accordance with the set of programmable logic device configurations.

20 Claims, 7 Drawing Sheets

1

APPARATUS AND METHOD FOR PROGRAMMING A SET OF PROGRAMMABLE LOGIC DEVICES IN PARALLEL

This application claims priority to the U.S. provisional patent application, "Apparatus and Method for Programming a Set of Programmable Logic Devices in Parallel," Serial No. 60/151,597 filed Aug. 30, 1999.

BRIEF DESCRIPTION OF THE INVENTION

This invention relates generally to techniques for configuring programmable logic devices. More particularly, this invention relates to a technique for programming a set of programmable logic devices in parallel.

BACKGROUND OF THE INVENTION

Field programmable logic devices are digital logic circuits that can be programmed to perform a variety of logical functions. A specified logical function is typically stored in a memory and is subsequently programmed into a single field programmable logic device. This prior art technique does not allow multiple programmable logic devices to be programmed from a single memory. Accordingly, it would be highly desirable to provide an improved technique wherein multiple programmable logic devices can be configured in parallel from a single memory.

SUMMARY OF THE INVENTION

The invention includes a method of configuring a set of programmable logic devices. The method includes the step of partitioning a programming file into a set of programmable logic device configurations. A set of programmable logic devices are subsequently configured, in parallel, in accordance with the set of programmable logic device configurations.

The invention also includes an electronic system with a set of programmable logic devices. A memory is connected to the set of programmable logic devices. The memory stores a set of programmable logic device configurations. A microprocessor is connected to the set of programmable logic devices and the memory. The microprocessor coordinates the routing of the set of programmable logic device configurations to the set of programmable logic devices.

The invention further includes a computer readable medium to direct a processor to function in a specified manner. A first set of instructions accesses a memory storing a set of programmable logic device configurations. A second set of instructions transfers, in parallel, the set of programmable logic device configurations to a corresponding set of programmable logic devices.

The technique of the invention significantly reduces programmable logic device configuration times. In addition, the invention supports reconfigurable digital systems.

BRIEF DESCRIPTION OF THE DRAWINGS

For a better understanding of the invention, reference should be made to the following detailed description taken in conjunction with the accompanying drawings, in which.

Like reference numerals refer to corresponding parts throughout the drawings.

DETAILED DESCRIPTION OF THE INVENTION

Figure 1:
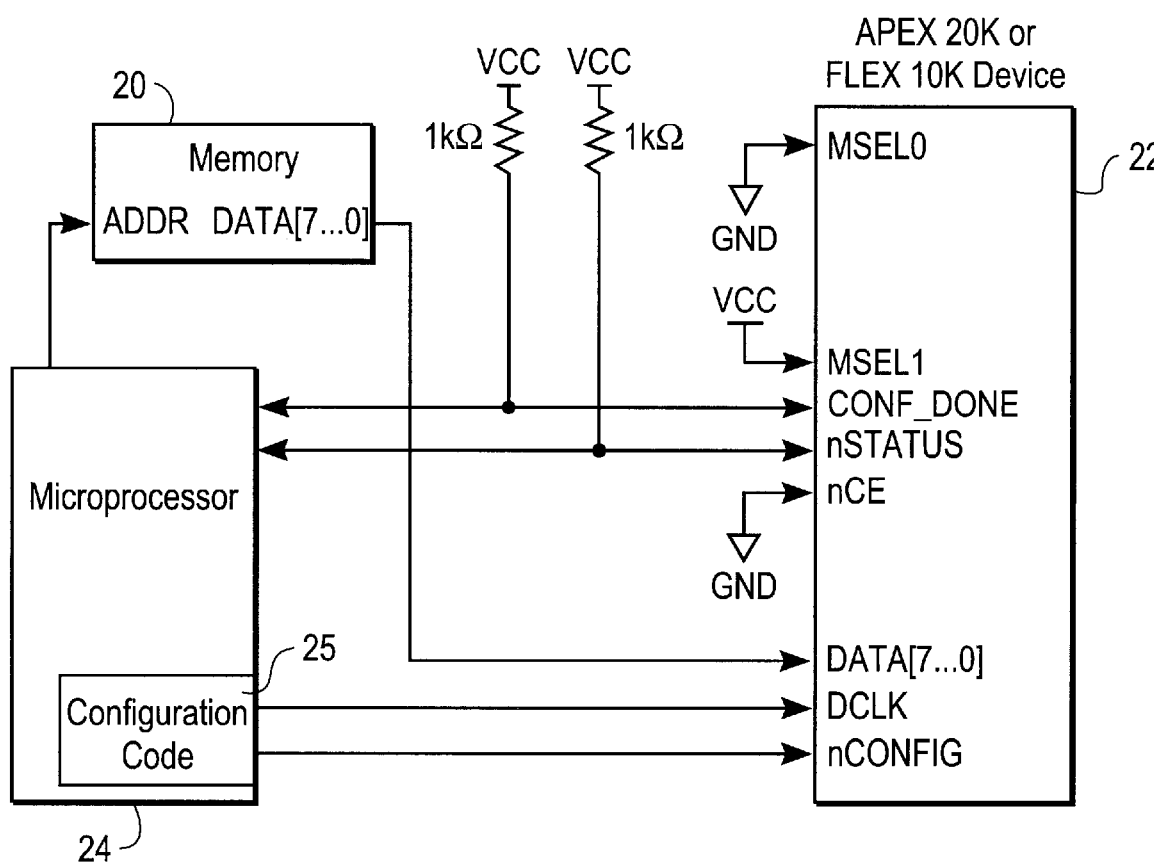
FIG. 1 illustrates a system for passive parallel synchronous programming of a set of programmable logic devices in parallel according to an embodiment of the invention.

FIG. 1 illustrates a system for passive parallel synchronous programming of a set of programmable logic devices in accordance with an embodiment of the invention. The figure illustrates a memory 20 which stores a programming pattern that is used to configure a programmable logic device 22. A microprocessor 24 coordinates the programming operation by controlling the CONF_DONE, nSTATUS, DCLK, and NCONFIG signals that are applied to the programmable logic device 22. These signals are controlled in accordance with a set of executable instructions forming configuration code 25, which is stored in the microprocessor 24, or which is stored in an external memory (not shown). The configuration data is sent from the memory 20 to the DATA [7 . . . 0] pins of the programmable logic device 22 in response to control signals generated by the configuration code 25.

As shown below, the memory 20 may include configuration information for a set of programmable logic devices. In this case, the microprocessor 24 configures the set of programmable logic devices in parallel.

Figure 2:
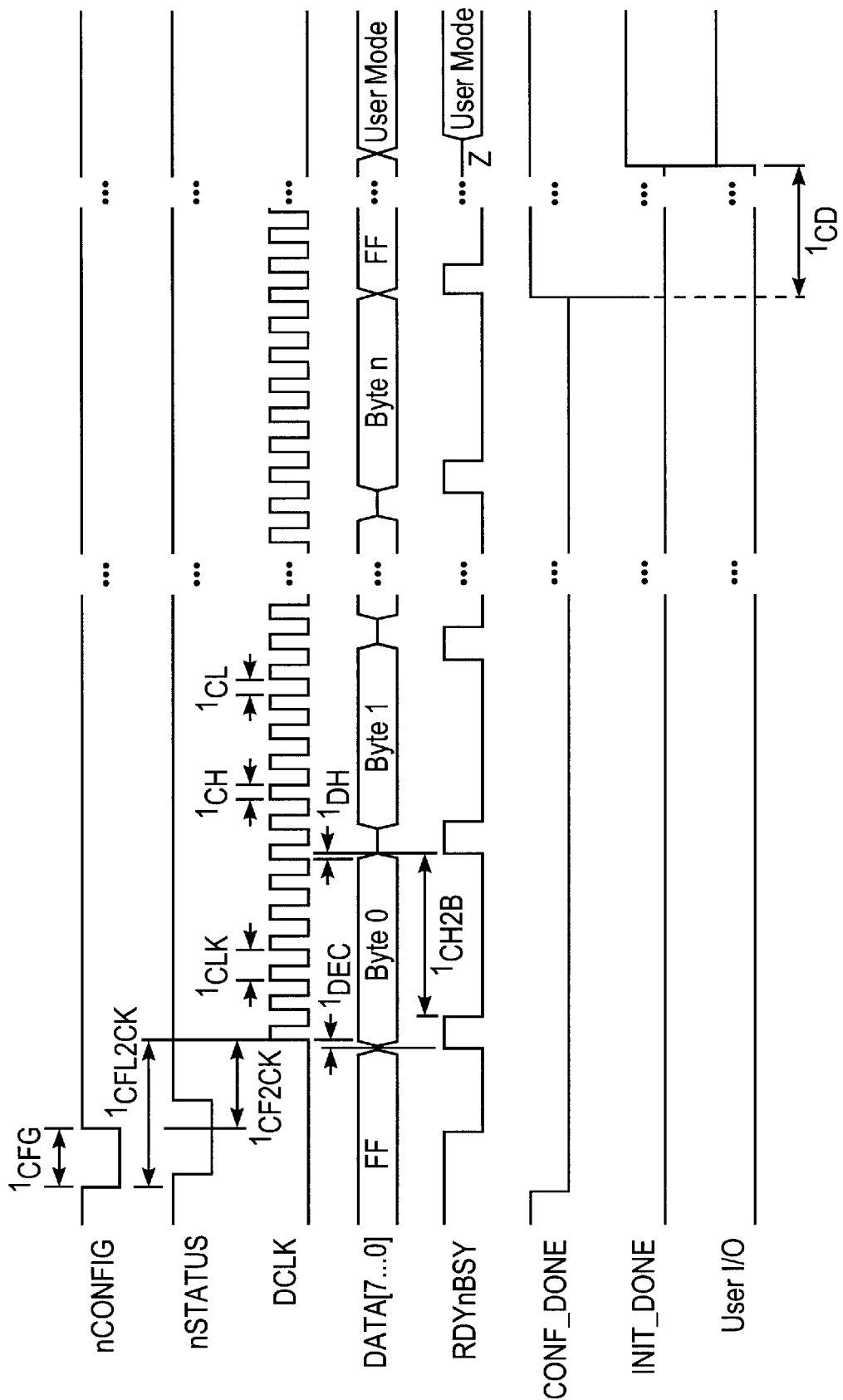
FIG. 2 illustrates timing signals that may be used with the system of FIG. 1.

FIG. 2 illustrates timing signals that may be used with the system of FIG. 1. The figure illustrates the signals corresponding to the pins shown in the system of FIG. 1.

As shown in FIG. 2, upon start-up of the system, the microprocessor 24 pulls the "nCONFIG" signal low temporarily. The microprocessor 24 then pulls the "nSTATUS" signal low briefly, placing the programmable logic device 22 in a condition to receive configuration information.

A clock signal, "DCLK", is then applied to the programmable logic device 22 from the microprocessor 24. Configuration data is then received from the memory 20 at the programmable logic device 22 in response to the clock signal. During data transmission, the RDYnBSY signal is held low.

FIG. 2 also illustrates that the "CONFIG_DONE" signal is held low during the configuration operation. A predetermined time after the "CONFIG_DONE" signal returns to a digital high state, the programmable logic device 22 may return to a user mode, as shown by the digital high user I/O signal on the right side of FIG. 2.

The signal control technique disclosed in connection with FIG. 2 may be used to configure a set of programmable logic devices in parallel. In particular, the microprocessor 24 applies the CONFIG_DONE, nSTATUS, DCLK, and nCONFIG signals to a set of programmable logic devices in parallel. Different sets of pins associated with the memory 20 are then used to route different sets of configuration data to respective programmable logic devices.

Figure 3:
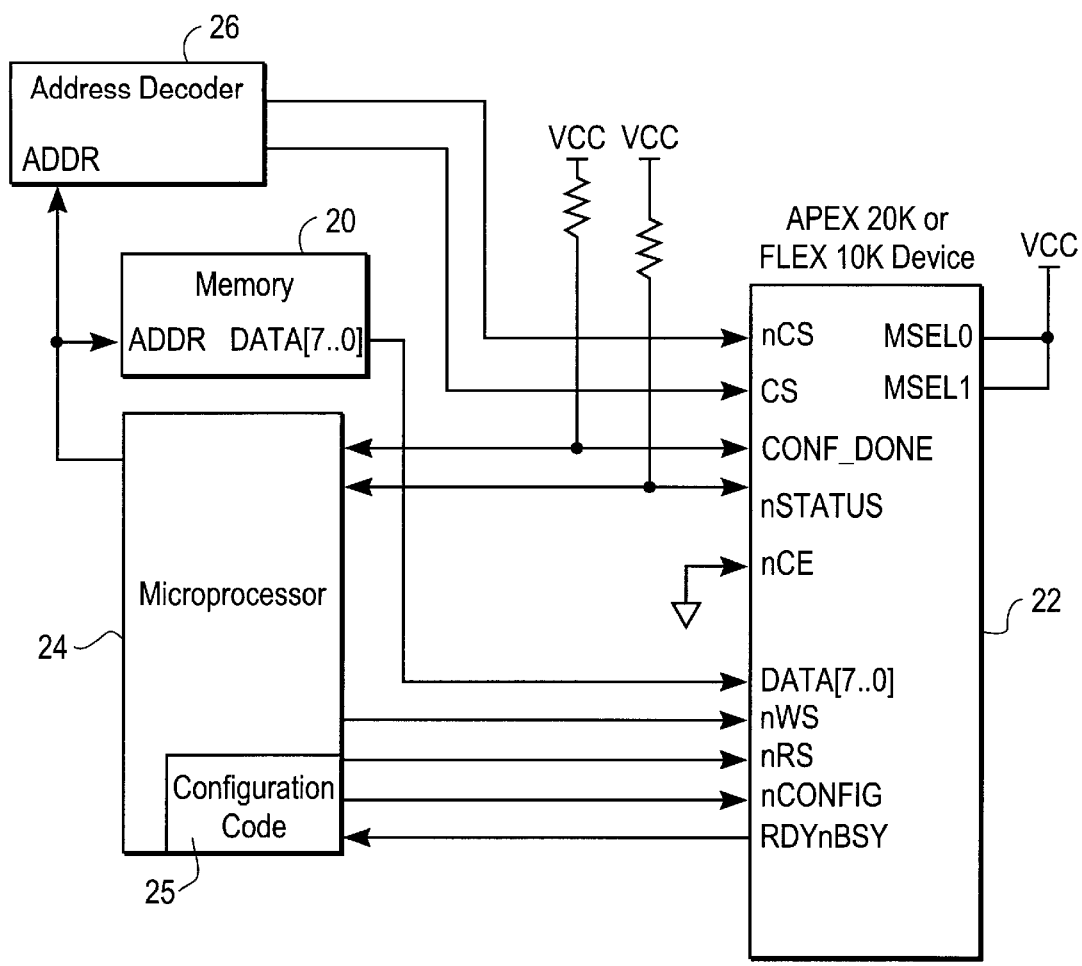
FIG. 3 illustrates a system for passive parallel asynchronous programming of a set of programmable logic devices in parallel according to another embodiment of the invention.

FIG. 3 illustrates a system for passive parallel asynchronous programming of a set of programmable logic devices in parallel according to another embodiment of the invention. The device of FIG. 3 generally corresponds to the device of FIG. 1, but it includes an address decoder 26, which is used during the programming operation.

Figure 4:
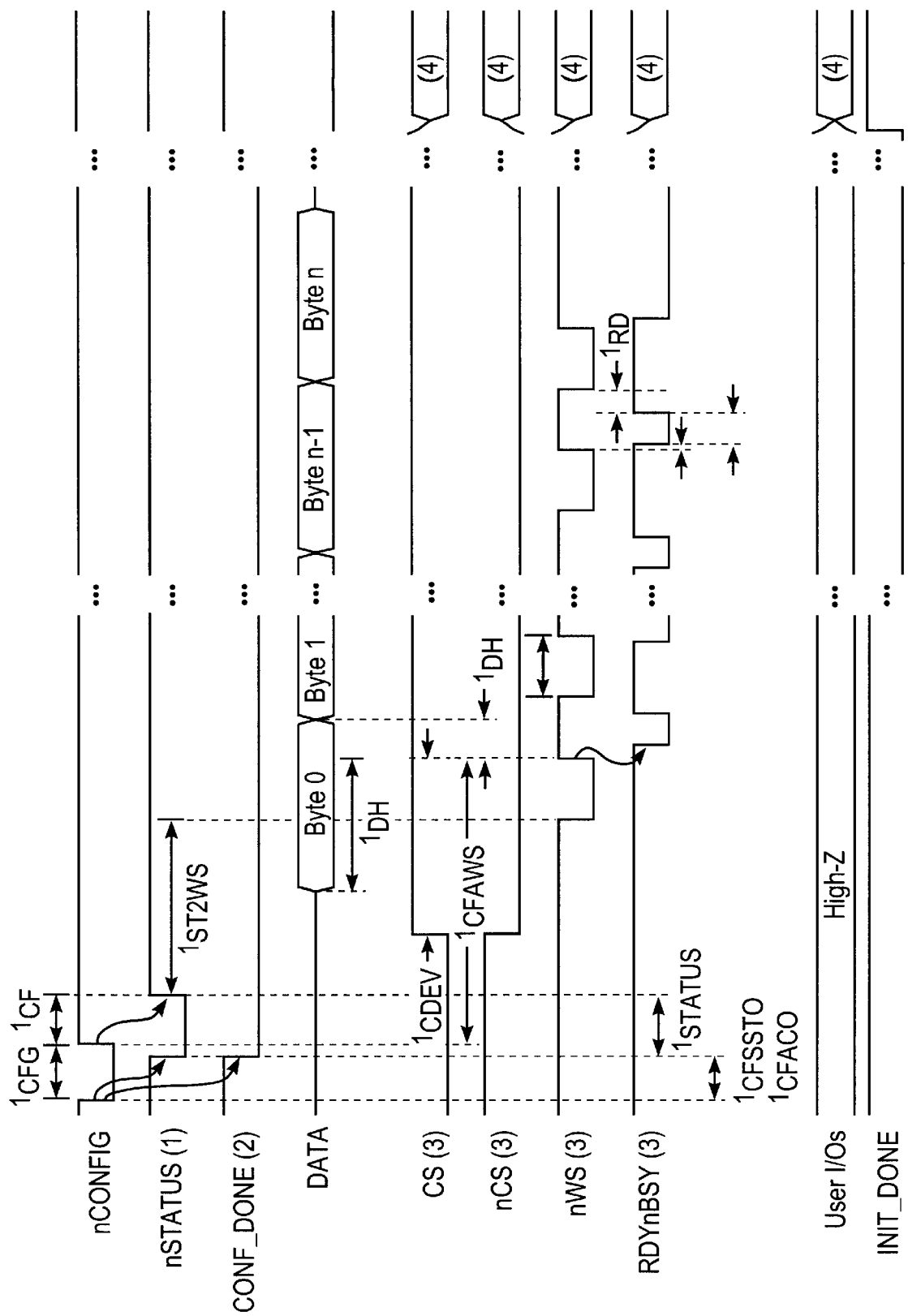
FIG. 4 illustrates timing signals that may be used with the system of FIG. 3.

FIG. 4 illustrates timing signals that may be used in the passive parallel asynchronous system of FIG. 3. The figure illustrates the signals corresponding to the pins shown in the system of FIG. 3.

As shown in FIG. 4, the configuration process begins when the "nCONFIG" signal is temporarily pulled low. This is followed by the "nSTATUS" signal being temporarily pulled low. The "CONF DONE" signal is pulled low during the configuration process.

As shown in FIG. 4, data is written from the memory 20 to the programmable logic device 22 in response to column select (CS) and write select (WS) signals. In particular, the column select signal is driven high, and the write select signal is temporarily pulled low when a byte is written to the programmable logic device 22.

As will be appreciated by those skilled in the art, the timing associated with FIG. 4 can be extended for a set of programmable logic devices 22. As in the case of the embodiment of FIG. 1, the signals from the microprocessor 24 to the programmable logic device 22 are distributed to a set of programmable logic devices. The memory 20 stores a set of configuration files corresponding to the set of programmable logic devices. Each configuration file has a corresponding set of data pins, which are connected to a designated programmable logic device. In this way, a single set of commands can be applied to a set of programmable logic devices, while a set of configuration files are delivered to a corresponding set of programmable logic devices in parallel.

Figure 5:
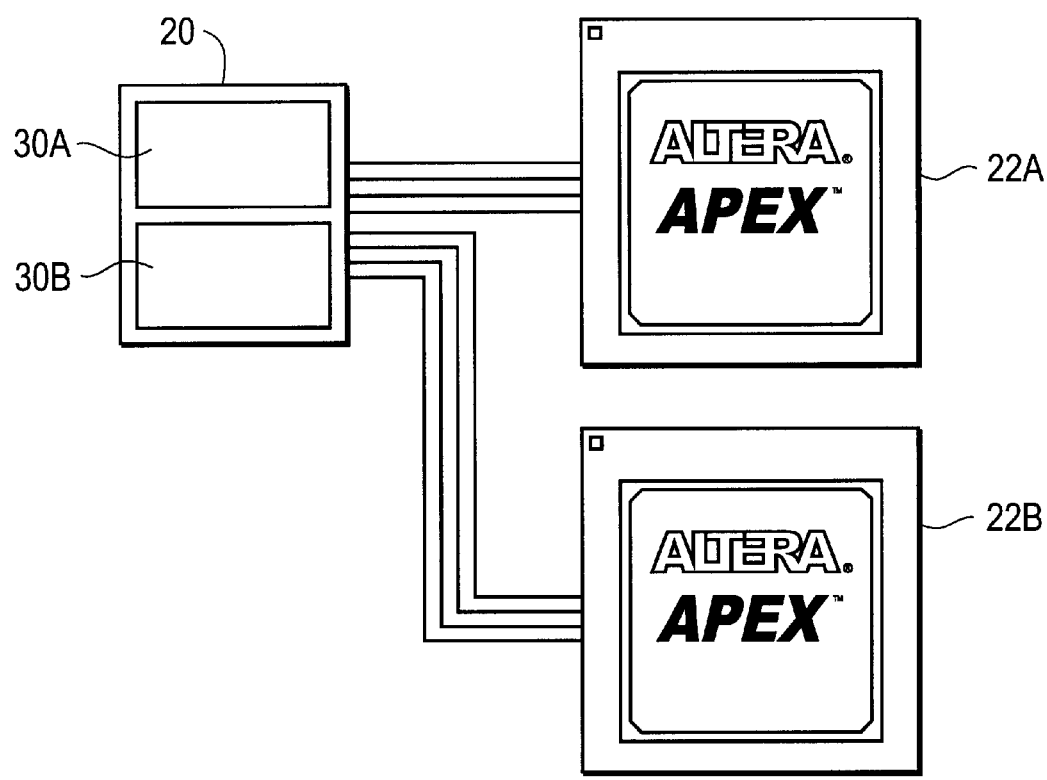
FIG. 5 illustrates the programming of two programmable logic devices in accordance with an embodiment of the invention.

FIG. 5 illustrates the programming of two programmable logic devices in accordance with an embodiment of the invention. In particular, the figure illustrates that the memory 20 is partitioned into a first configuration program 30A, which is used to program a first programmable logic device 22A. The figure also illustrates a second configuration program 30B, which is used to program a second programmable logic device 22B.

Figure 6:
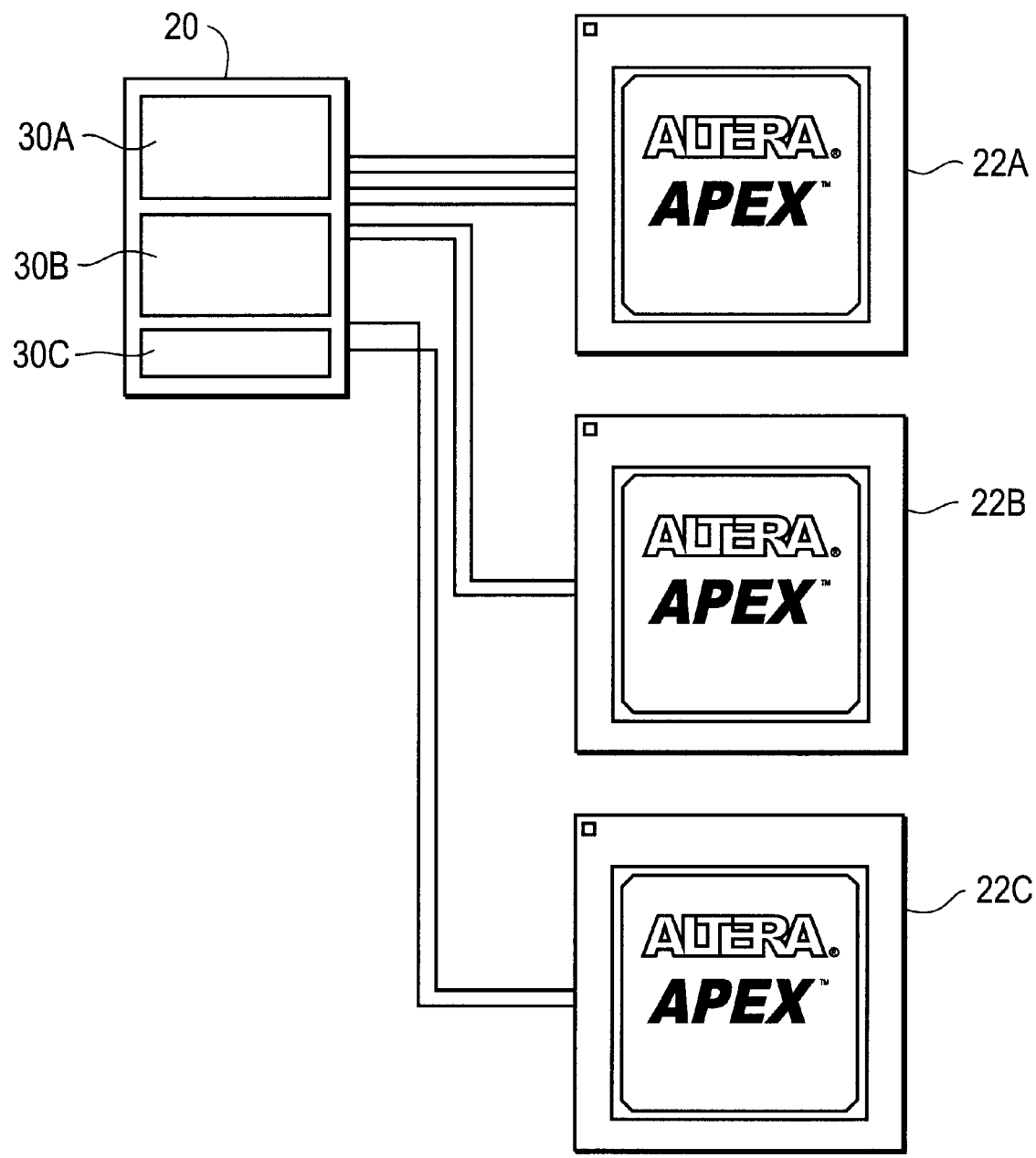
FIG. 6 illustrates the programming of three programmable logic devices in accordance with an embodiment of the invention.

FIG. 6 illustrates the programming of three programmable logic devices in accordance with an embodiment of the invention. The system of FIG. 6 generally corresponds to the system of FIG. 5, but it includes a third configuration program 30C, which is used to program a third programmable logic device 22C.

Preferably, the memory 20 utilized with the invention is configurable via an industry-standard 4-pin Joint Test Action Group (JTAG) interface (IEEE Std. 11149.1).

The invention establishes an N-bit wide configuration mode, where N can be 1, 2, 4, or 8. In the passive parallel synchronous mode N=2, 4, or 8. In the passive parallel asynchronous mode N=8. The protocol and pins do not change for these different schemes. The invention also supports the configuration of N PLDs through N channels in a serial mode.

The various modes of the invention may be selected via the MSEL pins of the programmable logic device 22. FIGS. 1 and 3 illustrate the MSEL pins. In one embodiment, the invention uses 3 MSEL option bits to choose between various programming schemes. An exemplary scheme is as follows:

| MSEL0 | MSEL1 | MSEL2 | ACTION |
|---|---|---|---|
| 0 | 0 | 0 | Passive Serial/Simultaneous Serial (1-to-N) |
| 0 | 0 | 1 | Passive Parallel Synchronous (8) |
| 0 | 1 | 0 | Passive Parallel Synchronous (4) |
| 0 | 1 | 1 | Passive Parallel Synchronous (2) |
| 1 | 0 | 0 | Passive Parallel Synchronous (8) |

The configuration program stored in the memory 20 may be in the form of a Programmer Object File (POF). As known in the art, a POF is a binary file used during the configuration of a programmable logic device.

The invention can be used to simultaneously configure up to eight programmable logic devices in a serial mode by relying upon eight programmable partitions of the configuration program array.

The invention also supports fast context switching and reconfigurable computing. For example, up to eight separate patterns may be loaded from memory into a single programmable logic device. By way of example, this feature may be used to support various HDTV formats on a single chip.

The invention has been implemented to support three serial clock modes. In a backwards compatible mode, the internal clock runs between 3.3 and 10 MHz. In a high speed mode, the clock operates at a minimum of 10 MHz. The maximum clock speed is defined by the highest memory read rate. In an external clock mode, the programmable logic device is responsive to a maximum high speed mode.

The programmable logic device or PLD (sometimes referred to as a PAL, PLA, FPLA, EPLD, EEPLD, LCA, or FPGA) allows a user to electrically program standard, off-the-shelf logic elements to meet a user's specific needs. See, for example, U.S. Pat. No. 4,617,479, incorporated herein by reference for all purposes. PLDs are currently represented by, for example, Altera's MAX® series of PLDs and FLEX® series of PLDs. The former are described in, for example, U.S. Pat. No. 5,241,224 and 4,871,930, and the Altera Data Book, June 1996, all incorporated herein by reference. The latter are described in, for example, U.S. Pat. No. 5,258,668; 5,260,610; 5,260,611; and 5,436,575, and the Altera Data Book, June 1996, all incorporated herein by reference.

Figure 7:
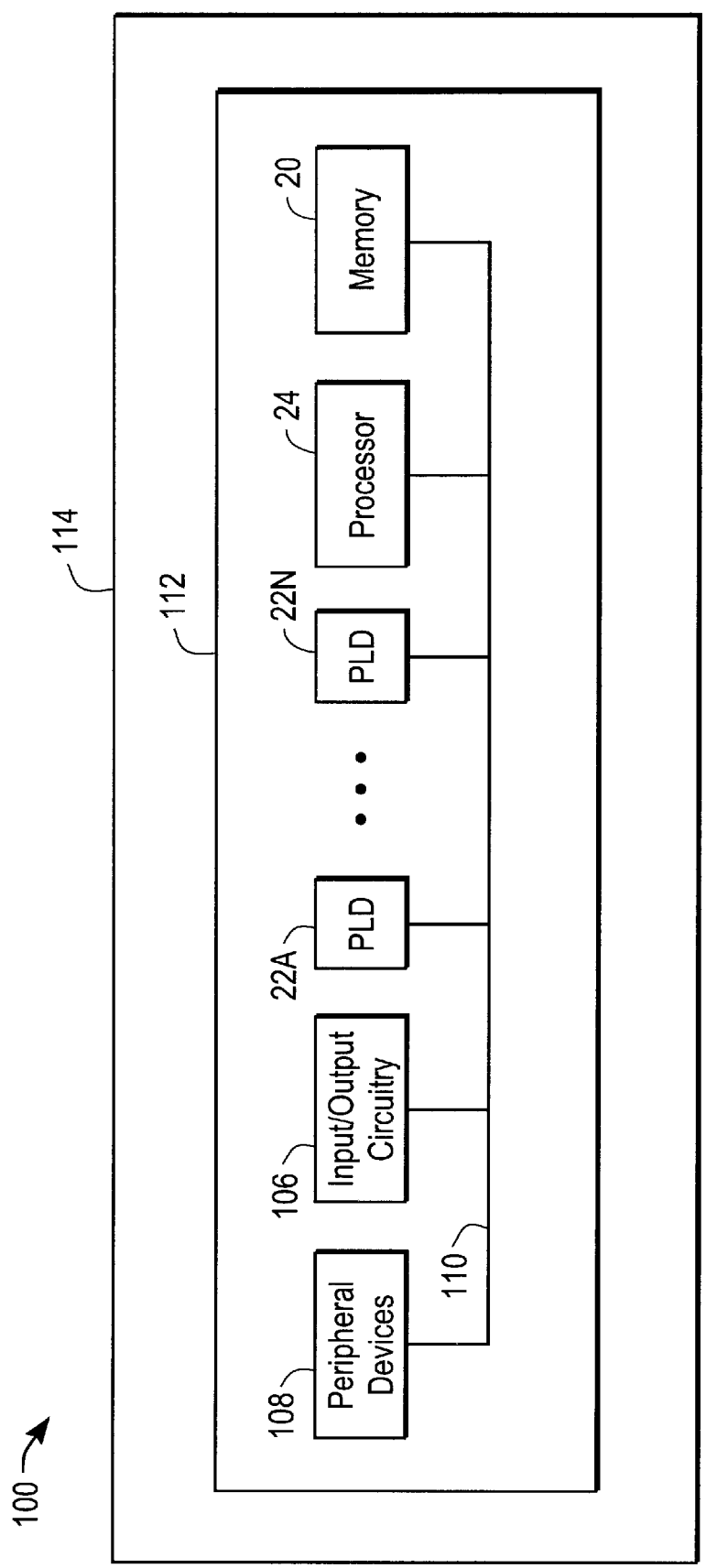
FIG. 7 illustrates the apparatus of the invention incorporated into a larger digital system.

FIG. 7 illustrates that the invention can be incorporated into a larger digital system 100. A set of PLDs 22A-22N form a part of a data processing system 100. The data processing system 100 may include one or more of the following components: a microprocessor 24, a memory 20 to store the set of configuration files, input/output circuitry 106, and peripheral devices 108. These components are coupled together by a system bus 110 and are populated on a circuit board 112, which is contained in an end-user system 114.

The system 100 can be used in a wide variety of applications, such as computer networking, data networking, instrumentation, video processing, digital signal processing, or any other application where the advantage of using re-programmable logic is desirable. The PLDs 22 can be used to perform a variety of logic functions. For example, one PLD 22 can be configured as a processor or controller that works in cooperation with processor 102. Another PLD 22 may also be used as an arbiter for arbitrating access to a shared resource in the system 100. In yet another example, a PLD 22 can be configured as an interface between the processor 102 and one of the other components in the system 100.

The foregoing description, for purposes of explanation, used specific nomenclature to provide a thorough understanding of the invention. However, it will be apparent to one skilled in the art that the specific details are not required in order to practice the invention. In other instances, well known circuits and devices are shown in block diagram form in order to avoid unnecessary distraction from the underlying invention. Thus, the foregoing descriptions of specific embodiments of the present invention are presented for purposes of illustration and description. They are not intended to be exhaustive or to limit the invention to the precise forms disclosed, obviously many modifications and variations are possible in view of the above teachings. The embodiments were chosen and described in order to best explain the principles of the invention and its practical applications, to thereby enable others skilled in the art to best utilize the invention and various embodiments with various modifications as are suited to the particular use contemplated. It is intended that the scope of the invention be defined by the following claims and their equivalents.

What is claimed is:

1. A method of configuring a set of programmable logic devices, said method comprising the steps of:
    partitioning a programming file into a set of programmable logic device configurations; and
    configuring, in parallel, a set of programmable logic devices in accordance with said set of programmable logic device configurations.

2. The method of claim 1 wherein said configuring is performed synchronously.

3. The method of claim 1 wherein said configuring is performed asynchronously.

4. An electronic system, comprising:
    a set of programmable logic devices;
    a memory connected to said set of programmable logic devices, said memory storing a set of programmable logic device configurations; and
    a microprocessor connected to said set of programmable logic devices and said memory, said microprocessor coordinating the routing of said set of programmable logic device configurations to said set of programmable logic devices.

5. The electronic system of claim 4 wherein said microprocessor coordinates the routing of said set of programmable logic device configurations to said set of programmable logic devices in a synchronous mode.

6. The electronic system of claim 4 wherein said microprocessor coordinates the routing of said set of programmable logic device configurations to said set of programmable logic devices in an asynchronous mode.

7. The electronic system of claim 4 further comprising a system bus connected to said set of programmable logic devices, said memory, and said microprocessor.

8. The electronic system of claim 7 further comprising a peripheral device connected to said system bus.

9. The electronic system of claim 7 further comprising input/output circuitry connected to said system bus.

10. The electronic system of claim 4, wherein said memory is partitioned into a set of partitioned areas corresponding to said set of programmable logic device configurations.

11. A computer readable medium to direct a computer to function in a specified manner, comprising:
    a first set of instructions to access a memory storing a set of programmable logic device configurations; and
    a second set of instructions to transfer, in parallel, said set of programmable logic device configurations to a corresponding set of programmable logic devices.

12. The computer readable medium of claim 11 wherein said second set of instructions transfer said programmable logic device configurations to said set of programmable logic devices in a synchronous mode.

13. The computer readable medium of claim 11 wherein said second set of instructions transfer said programmable logic device configurations to said set of programmable logic devices in an asynchronous mode.

14. An electronic system, comprising:
    a set of programmable logic devices including a first programmable logic device and a second programmable logic device;
    a memory connected to said set of programmable logic devices, said memory including a first set of data pins connected to the first programmable logic device and a second set of data pins connected to the second programmable logic device, said memory storing a set of programmable logic device configurations for said set of programmable logic devices; and
    a microprocessor connected to said set of programmable logic devices and to said memory, said microprocessor at least in part coordinating routing of a first one of the programmable logic device configurations to the first programmable logic device via the first set of data pins and routing of a second one of the programmable logic device configurations to the second programmable logic device via the second set of data pins.

15. The electronic system of claim 14 wherein said microprocessor coordinates the routing of said set of programmable logic device configurations to said set of programmable logic devices in a synchronous mode.

16. The electronic system of claim 14 wherein said microprocessor coordinates the routing of said set of programmable logic device configurations to said set of programmable logic devices in an asynchronous mode.

17. The electronic system of claim 14 further comprising a system bus connected to said set of programmable logic devices, said memory, and said microprocessor.

18. The electronic system of claim 17 further comprising a peripheral device connected to said system bus.

19. The electronic system of claim 17 further comprising input/output circuitry connected to said system bus.

20. The electronic system of claim 14 wherein said memory is partitioned into a set of partitioned areas corresponding to said set of programmable logic device configurations.

* * * * *